(12) United States Patent
Ke et al.

(10) Patent No.: US 11,150,189 B1
(45) Date of Patent: Oct. 19, 2021

(54) METHODS OF MANUFACTURING A LIGHT SOURCE CARRIER AND AN ELECTRONIC DEVICE, AND A LIGHT SOURCE QUALIFICATION METHOD

(71) Applicant: InnoLux Corporation, Miao-Li County (TW)

(72) Inventors: Wan-Ting Ke, Miao-Li County (TW); Allen Tseng, Miao-Li County (TW); Wen-Hsiang Liao, Miao-Li County (TW); Yi-Chen Chou, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 164 days.

(21) Appl. No.: 16/558,809

(22) Filed: Sep. 3, 2019

(51) Int. Cl.
*G01N 21/64* (2006.01)
*G01N 21/88* (2006.01)
*G01R 31/26* (2020.01)

(52) U.S. Cl.
CPC ..... *G01N 21/6489* (2013.01); *G01N 21/8806* (2013.01); *G01R 31/2635* (2013.01); *G01N 2021/646* (2013.01); *G01N 2021/6495* (2013.01); *G01N 2021/8867* (2013.01); *G01N 2201/0438* (2013.01); *G01N 2201/0484* (2013.01)

(58) Field of Classification Search
CPC ..... G01N 2021/646; G01N 2021/6495; G01N 2021/8867; G01N 21/6489; G01N 21/8806; G01N 2201/0438; G01N 2201/0484; G01R 31/2635
See application file for complete search history.

(56) References Cited

U.S. PATENT DOCUMENTS

| | | | | |
|---|---|---|---|---|
| 2012/0265467 | A1* | 10/2012 | Chang | G01R 31/2635 702/82 |
| 2013/0027543 | A1 | 1/2013 | Boeykens et al. | |
| 2014/0210995 | A1* | 7/2014 | Abe | H01L 33/005 348/93 |

* cited by examiner

*Primary Examiner* — Mark R Gaworecki
(74) *Attorney, Agent, or Firm* — McClure, Qualey & Rodack, LLP

(57) ABSTRACT

A method of manufacturing a light source carrier with at least one light source, including: providing a substrate with a plurality of light source groups disposed thereon, wherein each light source group includes the at least one light source; irradiating a first light upon one of the light source groups through a first mask; capturing a photoluminescent light emitted by the one of the light source groups to acquire data; comparing the data with a reference to determine whether the one of the light source groups is qualified; providing a carrier; and transferring the one of the light source groups from the substrate to the carrier if the one of the light source groups is qualified.

20 Claims, 11 Drawing Sheets

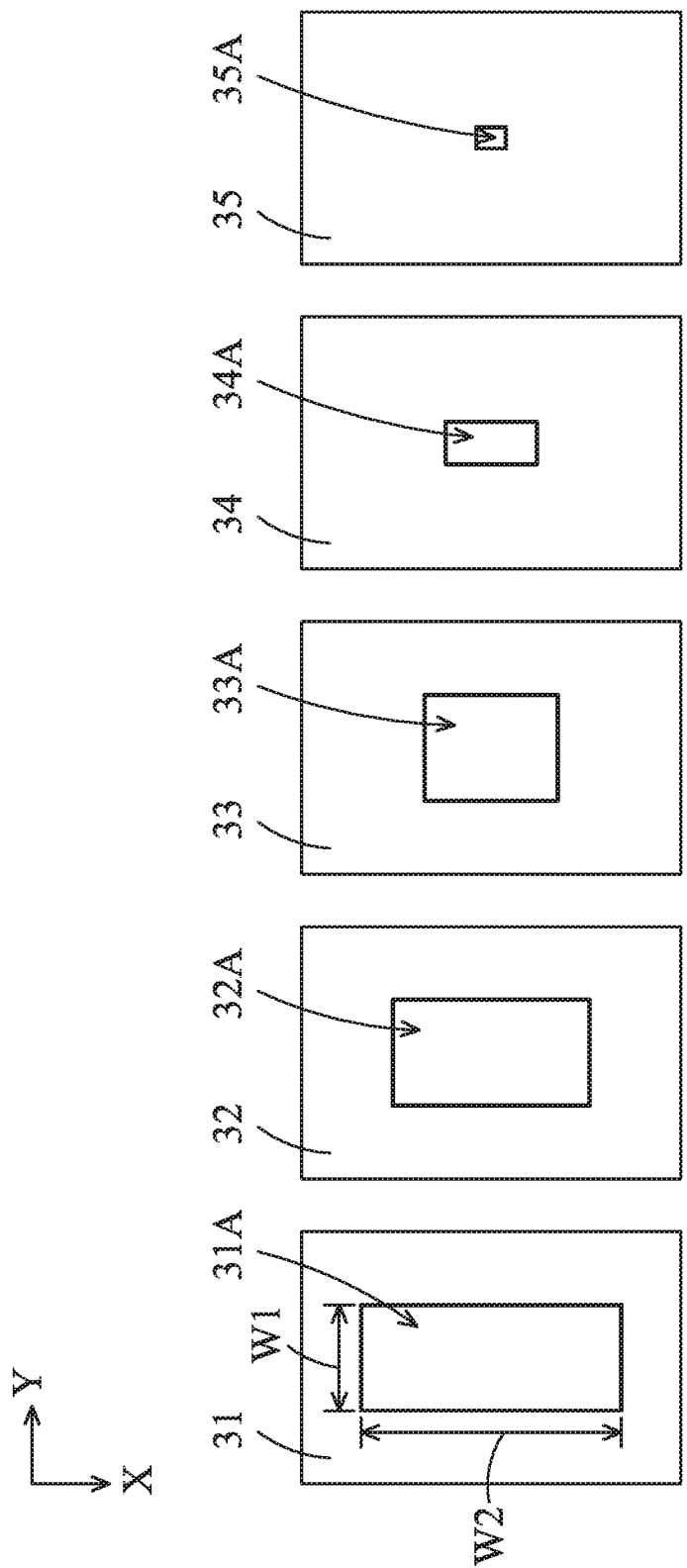

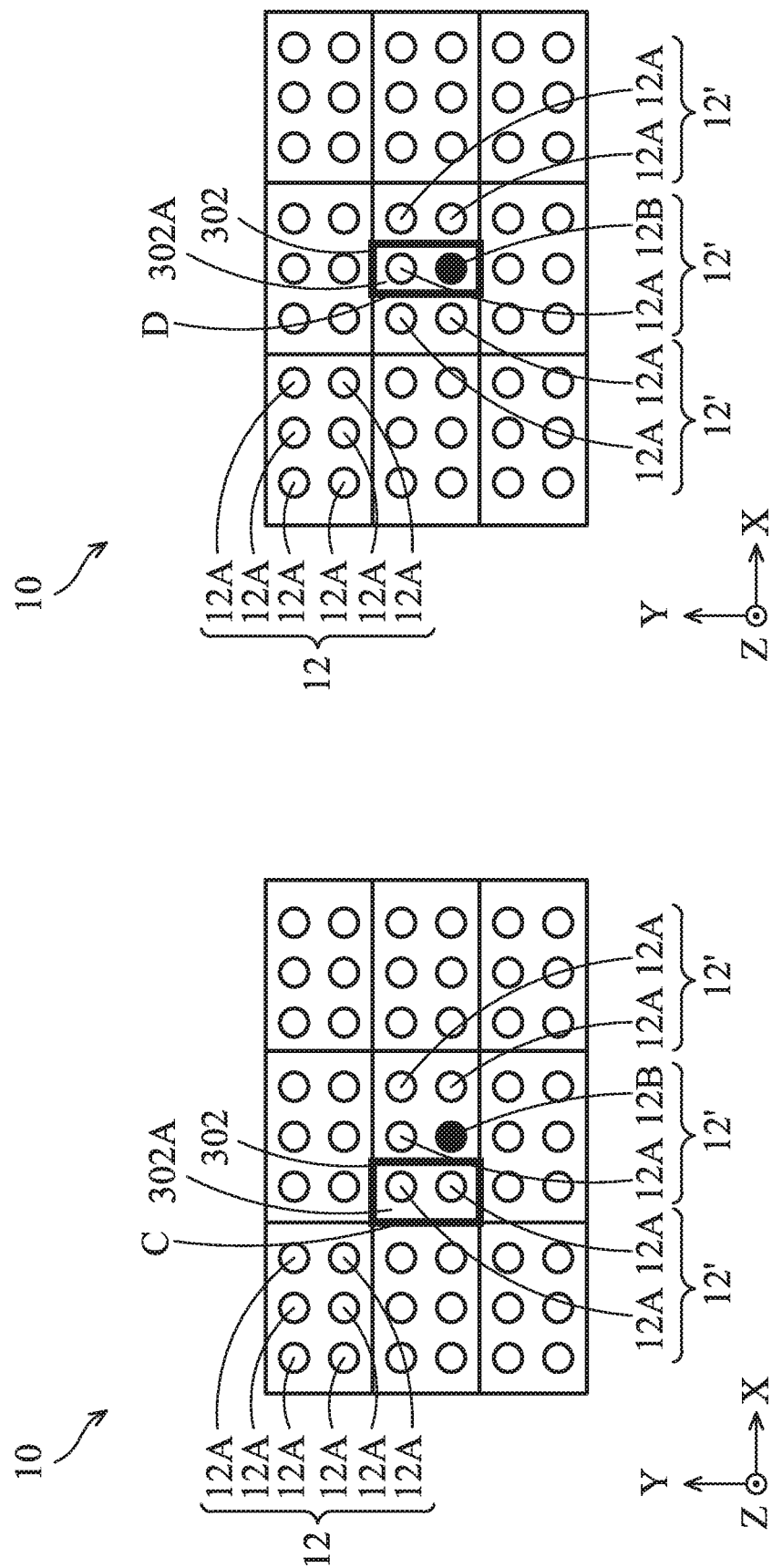

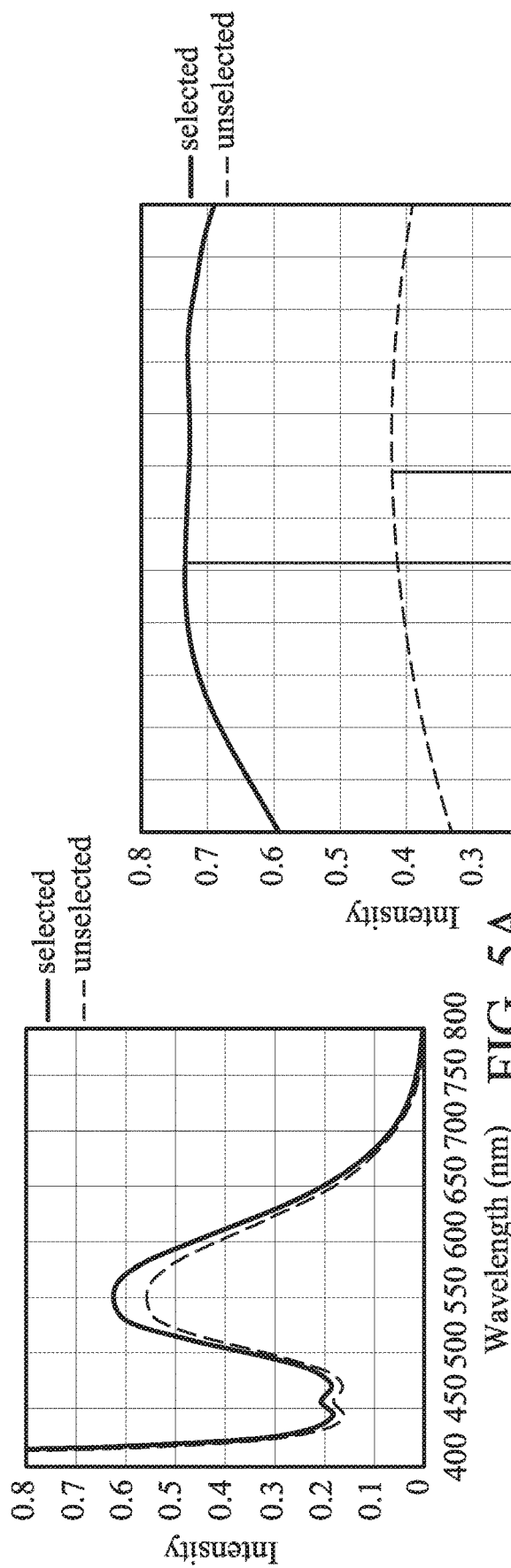
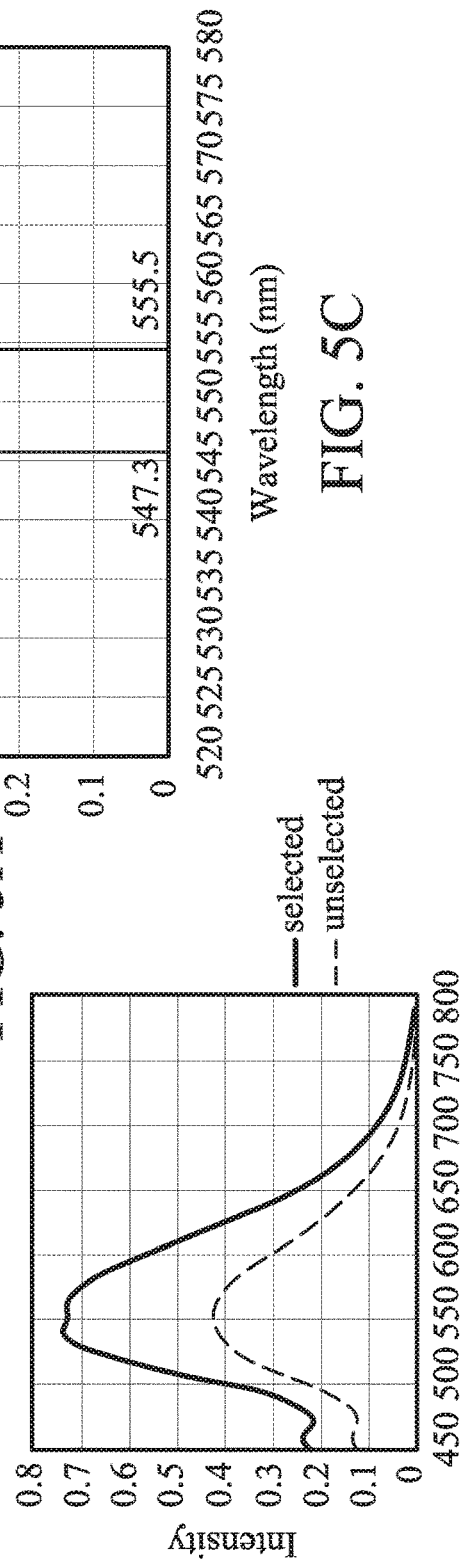
FIG. 5A
FIG. 5B
FIG. 5C

METHODS OF MANUFACTURING A LIGHT SOURCE CARRIER AND AN ELECTRONIC DEVICE, AND A LIGHT SOURCE QUALIFICATION METHOD

BACKGROUND OF THE DISCLOSURE

Field of the Disclosure

The disclosure relates to methods of manufacturing a light source carrier and an electronic device, and a light source qualification method.

Description of the Related Art

A light-emitting diode (LED) is a semiconductor light source that emits light when current flows through it. In a display device, LED defects (e.g. micro-cracks, uneven lightness, colorfulness does not meet requirement, etc.) are problems that reduce image quality over a large display area, so it is desired to find the position of the defects and the reasons for reduced brightness over a large area.

The current industry practice is to use an Electroluminescence (EL) method or an Automated Optical Inspection (AOI) method to check the quality and performance of LEDs. The EL method detects spectrum variations of an LED by passing different currents through the LED. The AOI method inspects the topography of the LED using an image sensor (such as a charge-coupled device (CCD)) to determine the position of any defects (e.g. physical defect, flashing, brightness or colorfulness does not meet requirement, etc.). However, it is hard to find a single LED defect over a large area using these methods, especially in a current LED display that has a high density of many small light sources (e.g. LED dies) formed on a substrate. Furthermore, the EL method cannot recognize whether a problem is caused by a circuit, the packaging, or the LED.

Although existing LED qualification methods have been generally adequate for their intended purposes, they have not been entirely satisfactory in all respects.

BRIEF SUMMARY OF THE DISCLOSURE

A method of manufacturing a light source carrier with at least one light source is provided in some embodiments of the present disclosure, including: providing a substrate with a plurality of light source groups disposed thereon, wherein each light source group comprises the at least one light source; irradiating a first light upon one of the light source groups through a first mask; capturing a photoluminescent light emitted by the light source group to acquire data; comparing the data with a reference to determine whether the light source group is qualified; providing a carrier; and transferring the light source group from the substrate to the carrier if the light source group is qualified.

A method of manufacturing an electronic device with at least one light source is provided in some embodiments of the present disclosure, including: providing a substrate with a plurality of light source groups disposed thereon, wherein each light source group comprises the at least one light source; irradiating a first light upon one of the light source groups through a first mask; capturing a photoluminescent light emitted by the light source group to acquire data; comparing the data with the reference to identify whether the light source group is qualified; providing a driving substrate; and transferring the light source group from the substrate to the driving substrate and bonding the light source group on the driving substrate if the light source group is qualified to form the electronic device.

A method of determining whether at least one light source is qualified is provided in some embodiments of the present disclosure, including: providing a substrate with a plurality of light source groups disposed thereon, wherein each light source group comprises the at least one light source; irradiating a first light upon one of the light source groups through a first mask; capturing a photoluminescent light emitted by the light source group to acquire data; and comparing the data with reference to identify whether the light source group is qualified.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2A to 2E are schematic views of a plurality of masks.
FIGS. 4A to 4I are schematic views illustrating the steps of the light source qualification method.
FIGS. 5A and 5B are diagrams showing the photoluminescent light relationship between a qualified (selected) light source and an unselected light source.
FIG. 5C is an enlarged view of FIG. 5B.

DETAILED DESCRIPTION OF THE DISCLOSURE

Figures 1A, 1B, 1C:
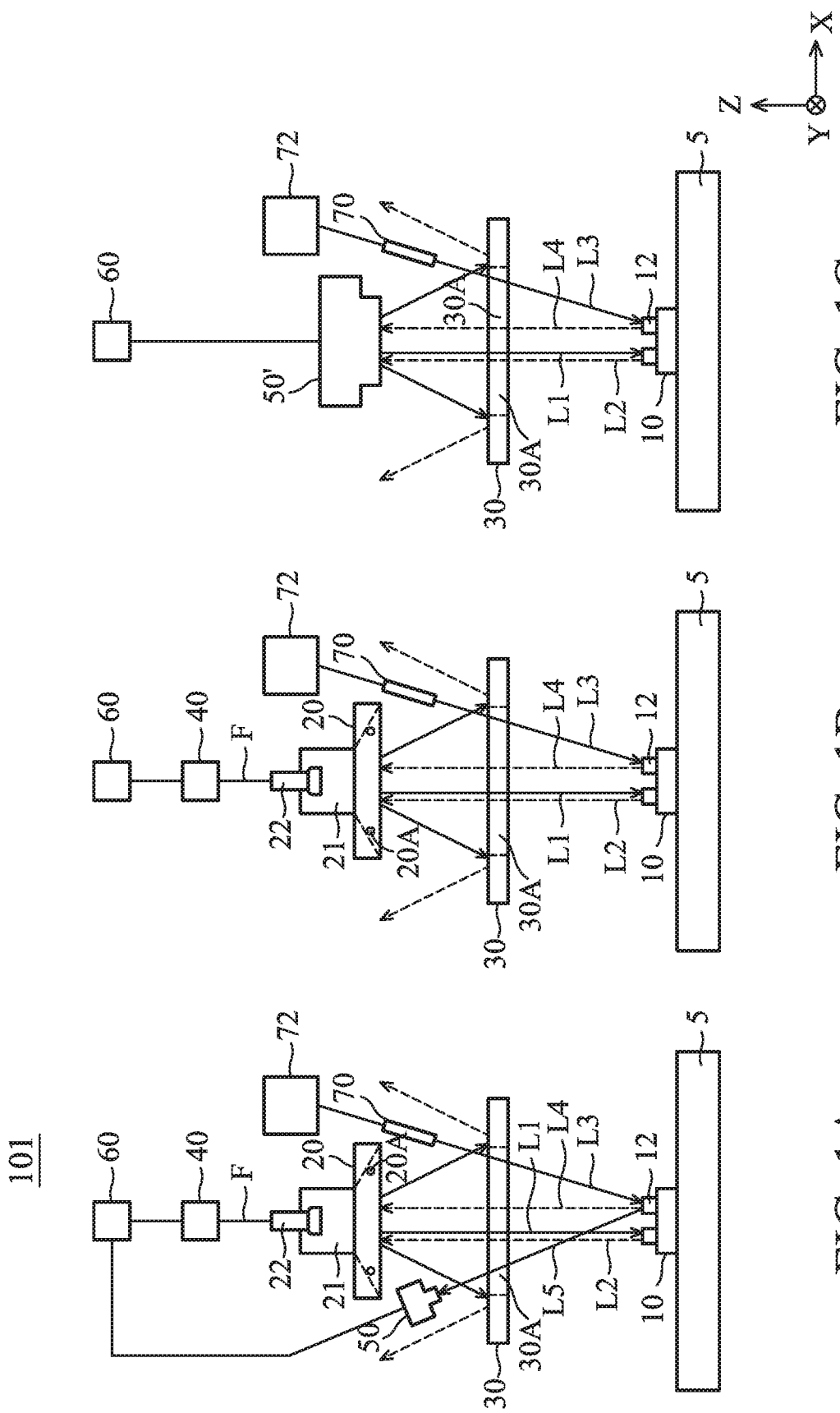
FIG. 1A is a schematic view of a detection system.
FIG. 1B is a schematic view of a detection system.
FIG. 1C is a schematic view of a detection system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, disposed on and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used for ease of the present disclosure of one features relationship to another feature. The spatially relative terms are intended to cover different orientations of the device including the features.

FIG. 1A is a schematic view of a detection system 101. The detection system 101 may include a substrate 10, a light source 20, a mask 30, a spectrometer 40, an image sensor 50, a computer 60, a light source 70, and a power source 72. A plurality of light source groups 12 are disposed on the substrate 10. Each light source group 12 may include at least one light source, such as the light sources 12A or 12B shown in FIGS. 4A to 4I. The light source 20 or the image sensor 50 may be positioned above the substrate 10, and the mask 30 may be positioned between the substrate 10 and the light source 20 or between the substrate 10 and the image sensor 50. In some embodiments, the substrate 10 may be provided on a movable holder 5 to move the position of the substrate 10. The following embodiments are taking the LED (a single LED die or a LED group formed from a plurality LED dies, such as the light source 12A or 12B) as an example of the light source, but the present disclosure is not limited thereto.

The substrate 10 may be a rigid substrate or a flexible substrate, and may include suitable materials such as polyimide (PI), polyethylene terephthalate (PET), glass, quartz, ceramic, sapphire or plastic, etc., but the present disclosure is not limited thereto. The substrate 10 may have any suitable shape in this disclosure.

The spectrometer 40 and the image sensor 50 may be electrically connected to the computer 60. In some embodiments, the image sensor 50 may be, for example, a charge-coupled device (CCD).

In some embodiments, the light source 20 may have, for example, a specific lamp 20A disposed in the light source 20, and the specific lamp 20A can provide a light having a specific wavelength and specific light intensity. The light source 20 may be connected to the spectrometer 40 by, for example, a fiber F. The fiber F may guide the light between the light source 20 and the spectrometer 40. In some embodiments, the light source 20 may be right above the light source groups 12 (i.e. arranged with each other in Z direction), but the present disclosure is not limited thereto. The light source 70 may be electrically connected to the power source 72, and the light source 70 may be a UV LED focus lamp that can provide a light having a specific wavelength. In some embodiments, the beam angle of the light source 20 may be 30 degrees to enhance the uniformity of the light and increase the irradiation area, but the present disclosure is not limited thereto. The beam angle of the light source 70 to the light source groups 12 and the distance between the light source 70 and the light source groups 12 may be adjusted based on design requirement, and is not limited. In some embodiments, the light source 20 may be a UV LED light source. In some embodiments, the light source 20 and the light source 70 may have different illumination area. For example, the light source 20 may illuminate a greater area than the light source 70, whereas the light source 70 may provide a focused light beam that may have higher light flux, but the present disclosure is not limited thereto.

In some embodiments, the wavelength of the light provided by the light source 20 or the light source 70 may be different. For example, the light source 20 may provide light L1 having a wavelength for about 371 nm, and the light source 70 may provide light L3 having a wavelength of about 365 nm, but the present disclosure is not limited thereto. The chosen wavelength may be determined based on the material of the light source (e.g. LED) that needs to be inspected. For example, the wavelength may be chosen based on the wavelength range that the material of the light source (e.g. LED) can be excited, such as the wavelength range of blue light used for exciting the light sources (e.g. LED dies or other types of light sources, and the present disclosure is not limited thereto). Furthermore, the intensity of the light provided by the light source 20 may be different from the intensity of the light provided by the light source 70. For example, the luminous intensity of light source 20 may be about 16000 mcd (millicandela) or 14.437 mW/cm$^2$, while the luminous intensity of light source 70 may be 400 mW/cm$^2$, but the present disclosure is not limited thereto. In some embodiments, the light source 20 can illuminate a light L1 having a specific wavelength to one of the light source groups 12 from the specific lamp 20A disposed in the light source 20 (such as disposed on the inner surface of the light source 20), and then the light source group 12 absorbs the incident light L1 generated by the light source 20 to illuminate light L2 (such as the dashed line in FIGS. 1A to 1C). In some embodiments, the light L2 may be fluorescence. The light L2 may be illuminated by, for example, photoluminescence or electroluminescence, photoluminescence is chosen as an example for illustrating purpose in the following description, but the present disclosure is not limited thereto. The fluorescence L2 may be collected by a concentrator 21 disposed on the light source 20, and then detected by a detector 22 disposed on the concentrator 21. In some embodiments, fluorescence L4 may be generated from the light source group 12 after the light source group 12 absorbs the incident light L3 generated by the light source 70. In some embodiments, light L3 illuminated from the light source 70 may be reflected by the light source group 12 as (reflect) light L5, which may be detected by the image sensor 50 to inspect the light source group 12. As a result, whether there is any undesirable or missing light source group 12 may be determined, but the present disclosure is not limited thereto. Afterwards, the data may be transferred to the spectrometer 40 to determine whether the light source group 12 includes any unselected light source (e.g. LED dies) or not. For example, the unselected light source of the light source group 12 may be recognized by comparing the intensity or wavelength difference of a peak of the fluorescence light of a sample to a "reference sample", which may be a sample with desired characteristic, but the present disclosure is not limited thereto. The method of using light to determine the characteristic of the material may be called as photoluminescence (PL) method. This method does not need to contact the material to be detected, so the material to be inspected may be prevented from being damaged.

In some embodiments, a detector 22 for detecting the light irradiated from the sample (e.g. fluorescence) may be assembled with the light source 20 and the concentrator 21. In this disclosure, fluorescence may be used as an example of the light irradiated from the sample, but the present disclosure is not limited thereto. The concentrator 21 may have a hollow cylinder shape, i.e. like a bucket, but the present disclosure is not limited thereto. The light source 20, the concentrator 21, and the detector 22 may be separable based on different requirements. In some embodiments, coating that can control the incident light (e.g. absorb some of the incident light) may be provided on the inner surface of the concentrator 21 that is disposed between the light source 20 and the detector 22 to ensure the detected light is uniform.

In some embodiments, the mask 30 may have a plate shape and may include an opening 30A formed thereon. In some embodiments, the mask 30 may include any material that can block light with a specific range of wavelength. For example, if the incident light L1 with a specific wavelength is provided by the light source 20 or the light source 70, the mask 30 may block some of the incident light L1 to ensure only a portion of the UV light passing through the opening of the mask 30 to control the area being illuminated, as shown by the arrows in FIG. 1A.

In some embodiments, the image sensor 50 may be omitted, such as the detection system 102 shown in FIG. 1B, and the fluorescence L2 and L4 may be detected by the detector 22. As a result, the number of the element of the detection system 102 may be reduced.

In some embodiments, the light source 20, the detector 22, and the spectrometer 40 may be omitted, and the image sensor 50 may be designed to have similar functions of the detector 22 and the spectrometer 40, such as the detection system 103 shown in FIG. 1C. As a result, the number of the element of the detection system 103 may be reduced. Furthermore, in this embodiment, the image sensor 50 may be positioned right above the light source group 12 (i.e. arranged in Z direction), but the present disclosure is not limited thereto.

In some embodiments, a set of masks may be used for the detection systems 101, 102 or 103 rather than using a single mask 30 shown in FIGS. 1A to 1C. For example, FIG. 2A to 2E are schematic views of a set of masks 31, 32, 33, 34 and 35, which include openings 31A, 32A, 33A, 34A, and 35A, respectively. The difference between the masks 31, 32, 33, 34 and 35 is that the area of the openings 31A, 32A, 33A, 34A, and 35A are different, such as the areas shown in Table 1. In some embodiments, the masks may have identical sizes, but the sizes of the openings may be different. For example, as shown in Table 1, the size of the opening 31A may be 52 mm in X direction (i.e. W2) and 29 mm in Y direction (i.e. W1), and the size of the opening 32A may be 39 mm in X direction and 29 mm in Y direction, but the present disclosure is not limited thereto. In the detection systems 101 or 102, the light provided by the light source 20 may pass through the opening to the light sources disposed on the substrate 10, and different sizes of the openings allow different amount of light sources being illuminated. Some example of the relationship between the sizes of the openings 31A, 32A, 33A, 34A, and 35A and the numbers of light sources that can be illuminated are shown in Table 1. It should be noted that greater the area of the opening of the mask, more light source (e.g. LED) can be illuminated. Although the masks have rectangular shapes in FIGS. 2A to 2E, the present disclosure is not limited thereto. For example, the shape of the mask and the opening may be circular or arbitrary shapes, depending on design requirements.

TABLE 1

| Opening | 31A | 32A | 33A | 34A | 35A |
|---|---|---|---|---|---|
| Size (mm * mm) | 29 * 52 | 29 * 39 | 25 * 25 | 9.5 * 17 | 4 * 4 |
| Number of LED to be illuminated (#) | 405 | 300 | 169 | 40 | 4 |

In some embodiments, the set of masks may include different number of masks, or the sizes of the openings may be adjusted based on design requirements. Another example of the set of the masks is shown in Table 2. In this example, the mask 35A may be omitted, or the size of the openings 31A, 32A, 33A and 34A may be changed from the examples shown in Table 1.

TABLE 2

| Opening | 31A | 32A | 33A | 34A |
|---|---|---|---|---|
| Size (mm * mm) | 25 * 25 | 9.5 * 17 | 4 * 4 | 2 * 2 |
| Number of LED to be illuminated (#) | 169 | 40 | 4 | 2 |

Figure 3:
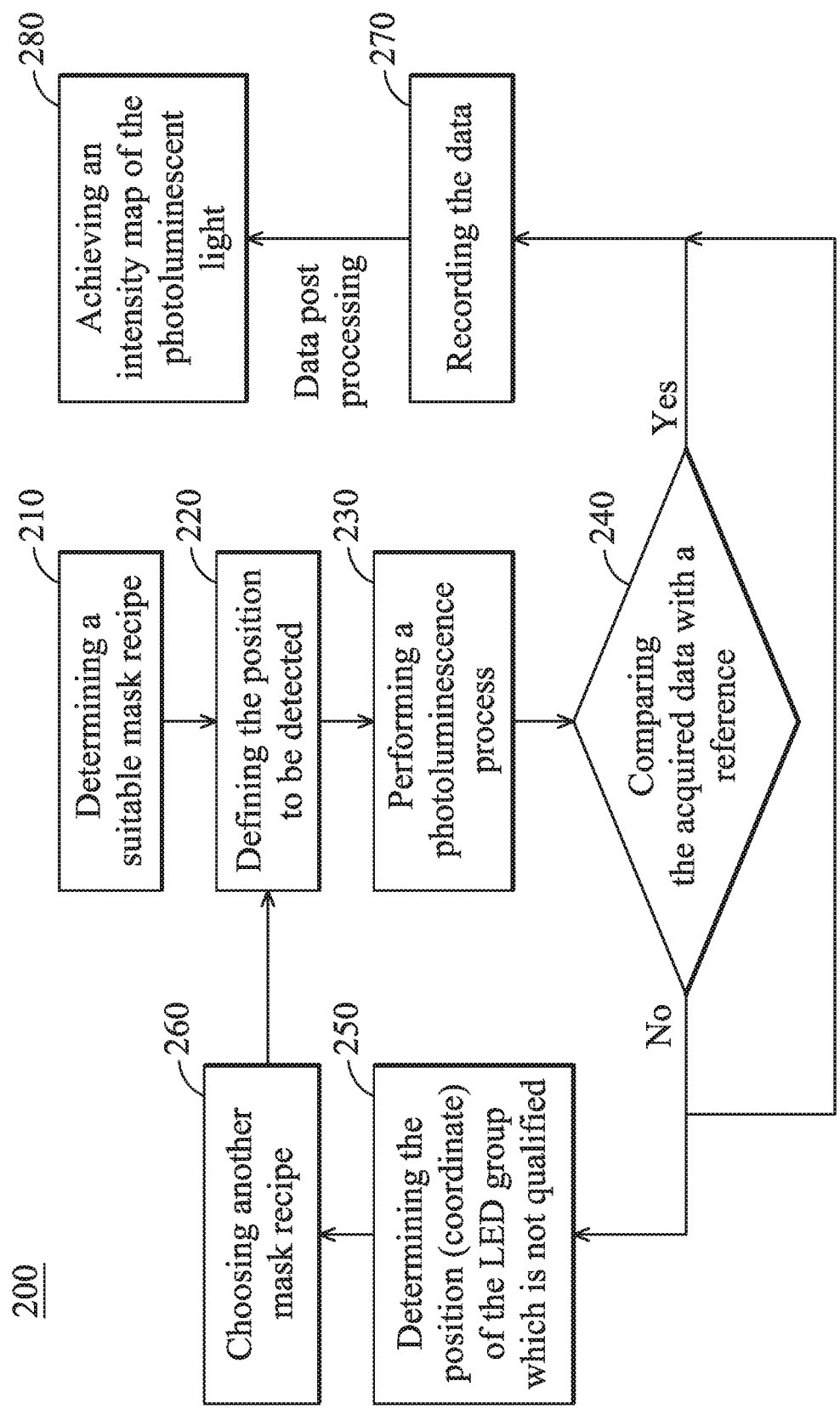
FIG. 3 is a flowchart of a light source qualification method in accordance with some embodiments.

FIG. 3 is a flowchart of an light source (e.g. LED) qualification method 200 in accordance with some embodiments. Some of the operations described below can be replaced or eliminated in different embodiments. Alternatively, some operations may be added in different embodiments. The light source (e.g. LED) qualification method 200 includes a number of operations (210, 220, 230, 240, 250, 260, 270, and 280).

Before operation 210, a substrate with a plurality of light source groups disposed thereon is provided, such as the light source groups 12 disposed on the substrate 10 of the detection systems 101, 102 or 103 described above. It should be noted that each light source group 12 includes at least one light source (e.g. LED die). In operation 210, a suitable mask recipe may be determined for subsequent operations based on, for example, the amount or the density of the light source groups 12, but the present disclosure is not limited thereto. After operation 210, a first mask may be chosen for the following operations. The first mask may be the mask having the greatest opening among the set of the masks used in the light source qualification method 200 based on the mask recipe. For example, the mask 31 with the greatest opening 31A may be chosen as the first mask among the set of the masks 31, 32, 33, 34 and 35.

In operation 220, the position to be detected (e.g. a first position) may be defined after the mask recipe is chosen in operation 210. The position to be detected may be defined by, for example, the region that required to be inspected, and may be exported as coordinate data, but the present disclosure is not limited thereto. Afterwards, the substrate may be moved to another position based on the position to be detected rather than moving the position of the light source, the detector, or the mask, but is not limited thereto. As a result, errors caused from moving the light source, the detector, or the mask may be reduced.

In operation 230, after the position (e.g. the first position) is defined, the substrate 10 is moved to a position (e.g. the first position), and a photoluminescence process is performed to the light source groups 12. It should be noted that photoluminescent light is used as an example of the light emitted from the light source groups 12 afterwards for description purpose, and is not limited thereto. Specifically, one of the light source groups 12 on the substrate 10 may be irradiated by first light through the first mask chosen in operation 210 (such as the mask 31, 32, 33, 34 or 35, but is not limited thereto), and then photoluminescent light emitted from the light source group 12 may be captured to acquire data. In some embodiments, the first light may be generated by the light source 20, and the emitted photoluminescent light emitted by the irradiated light source may be detected by the detector 22 of the detection system 101.

In some embodiments, operation 230 may further include moving the substrate 10 from the first position to a second position if the data of the light source groups 12 related the first position is already acquired. After the substrate 10 is moved to the second position, the first light is irradiated upon another one of the light source groups 12 through the first mask, and another photoluminescent light emitted by the other one of the light source groups 12 is captured to acquire another data related to the second position. Afterwards, the data related to the second position is compared with the reference to identify whether another one of the light source groups 12 is qualified until all of the light source groups 12 that need to be qualified are inspected. It should be noted that the incident light used in the operation related to the first position is identical to that of the second position (i.e. the first light), such as having identical wavelength or intensity, because the incident light at different positions is illuminated from an identical light source. In some embodiments, the operation 230 may include electroluminescence method.

In operation 240, the data acquired in operation 230 is compared with a reference to determine whether the light source group 12 is qualified (selected). The reference may be data acquired from a reference sample, which may be a sample with desired characteristic or a sample that has qualified light profile based on design requirement, but the present disclosure is not limited thereto. For example, the "qualified light profile" may represent the light emitted from the sample to be tested having similar profile (e.g. peak wavelength and/or peak intensity) to the light emitted from the reference sample, such as having an error less than a certain amount, but the present disclosure is not limited thereto. In some embodiments, the data may include information of the coordinates and information related to a peak of the photoluminescent light, such as the intensity of the peak of the photoluminescent light, a wavelength of the peak of the photoluminescent light, etc. In some embodiments, operation 240 may include comparing the intensity of the peak of the photoluminescent light with the reference acquired from the reference sample. In some embodiments, operation 240 may include comparing the wavelength of the peak of the photoluminescent light with the reference. The position of the peak may be defined by a peak of the reference sample that has the highest intensity. Afterwards, the peak of the reference sample may be compared with a corresponding peak of sample, such as comparing the wavelength, the intensity or both of them, and is not limited thereto. For example, if blue light is emitted from the sample to be tested, the reference sample may then have a peak of 460 nm wavelength. Afterwards, the light emitted from the sample to be tested may be compared with the wavelength and/or the intensity of the light that has 460 nm wavelength peak. However, the position of the peak of the reference sample may be adjusted based on requirement, and the present disclosure is not limited thereto. Whether a sample is qualified may be determined by comparing its peak intensity and/or wavelength to that of a reference sample, and is not limited thereto.

If the light source group 12 is not qualified (unselected), the light source (e.g. LED) qualification method 200 then goes to operation 250 to determine the position (coordinate) of the light source group 12 which is not qualified (unselected).

After the coordinates of the light source group 12 which is not qualified (unselected) are determined, another mask recipe is chosen for another photoluminescence process in operation 260. For example, a second mask having a second opening smaller than the first mask may be chosen as another mask recipe. For example, if the mask 31 is chosen as the first mask, and then the mask 32 which has a smaller second opening 32A may be chosen as the second mask, depending on design requirements.

Afterwards, the light source qualification method 200 goes to operations 220, 230 and 240 again to perform another photoluminescence process. In particular, in operation 230, second light may be irradiated upon a light source sub-group of one of the light source groups 12 through a second mask if the light source group 12 is not qualified after comparing it with the reference, and then another photoluminescent light emitted by the light source sub-group may be captured to acquire another data. It should be noted that a light source group 12 may include a plurality of light source sub-groups. In some embodiments, the first light may have an identical wavelength to the second light. In operation 240, another data acquired from the light source sub-group may be compared with the reference to determine whether the light source sub-group is qualified. In some embodiments, the first light and the second light may be irradiated by different light sources, such as the light source 20 and the light source 70, respectively. As a result, the first light and the second light may have different light intensity, such as an intensity of the first light may be less than an intensity of the second light, but the present disclosure is not limited thereto. In some embodiments, the light intensity may be measured by an identical apparatus at an identical distance for different light, but the present disclosure is not limited thereto.

In some embodiments, a carrier may be provided after operation 240 or 260, and then the light source group or the light source sub-group may be transferred from the substrate to a carrier if it is qualified to form a light source carrier. Please note that the "carrier" described here may be any suitable semiconductor substrate or a dielectric substrate, but is not limited thereto. In some embodiments, the carrier may include a thin-film transistor (TFT), but the present disclosure is not limited thereto. In some embodiments, the thin-film transistor may be a top gate, bottom gate, double gate thin film transistor, or combination thereof. The thin-film transistor may include a semiconductor layer including at least one of amorphous silicon, low temperature polysilicon (LTPS) and metal oxide, but the present disclosure is not limited thereto. The carrier then may be used for an electronic device, such as a display device including liquid crystal (LC), organic light-emitting diode (OLED), quantum dot (QD), fluorescent material, phosphor material, light-emitting diode (LED), mini light-emitting diode (Mini LED), micro light-emitting diode (Micro LED) or other display medium, but the present disclosure is not limited thereto.

In some embodiments, a driving substrate may be provided after operation 240, and then the light source group 12 (or the light source sub-group) may be transferred from the substrate 10 to the driving substrate, and the light source group 12 (or the light source sub-group) may be bonded on the driving substrate if it is qualified. Please note that the "driving substrate" described here may be any suitable substrate that has driving circuit (such as a flexible printed circuit (FPC) or a printed circuit board (PCB), etc.) disposed thereon, such as semiconductor substrate (e.g. a wafer), or may be a dielectric substrate, but is not limited thereto. In some embodiments, the driving substrate may include at least one thin-film transistor (TFT). For example, the thin-film transistor may be a top gate, bottom gate, double gate thin film transistor, or a combination thereof. The driving substrate then may be used for an electronic device, such as a display device including liquid crystal (LC), organic light-emitting diode (OLED), quantum dot (QD), fluorescent material, phosphor material, light-emitting diode (LED), mini light-emitting diode (Mini LED), micro light-emitting diode (Micro LED) or other display medium, but the present disclosure is not limited thereto.

After operation 240, no matter whether light source group 12 or the light source sub-group is qualified or not, operation 270 is performed to record the data gained from the spectrometer 40. The data may be, for example, a result of whether the one of the light source groups 12 is qualified or no, such as a comparison data of the light source group 12 or the light source sub-group to the reference sample, and the expression of the result may be adjusted based on different requirements. For example, the result may be a difference between the measured values (such as wavelength difference or intensity difference) of the light source group 12 or the light source sub-group to the reference sample, or may be a comparison result with an initial data to determine whether the light source group 12 or the light source sub-group is qualified or not. Afterwards, operation 280 is performed to achieve an intensity map of the photoluminescent light detected base on the recorded data in operation 270. The intensity map may help the operator to determine the position where the light source groups 12 should be moved, such as moved to another substrate in subsequent processes.

Figure 4B:
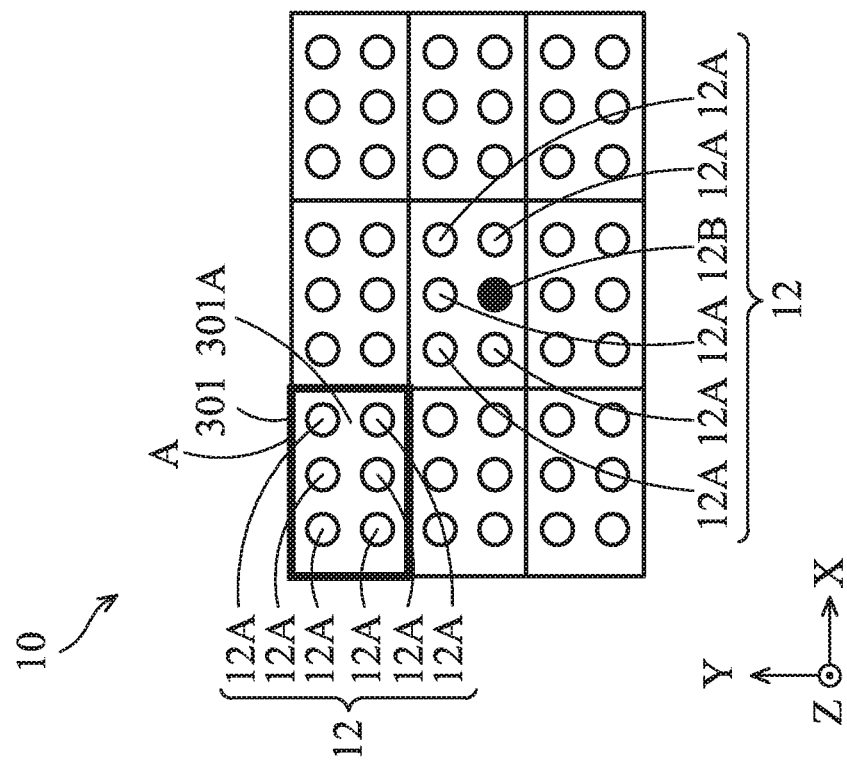
Figure 4A:
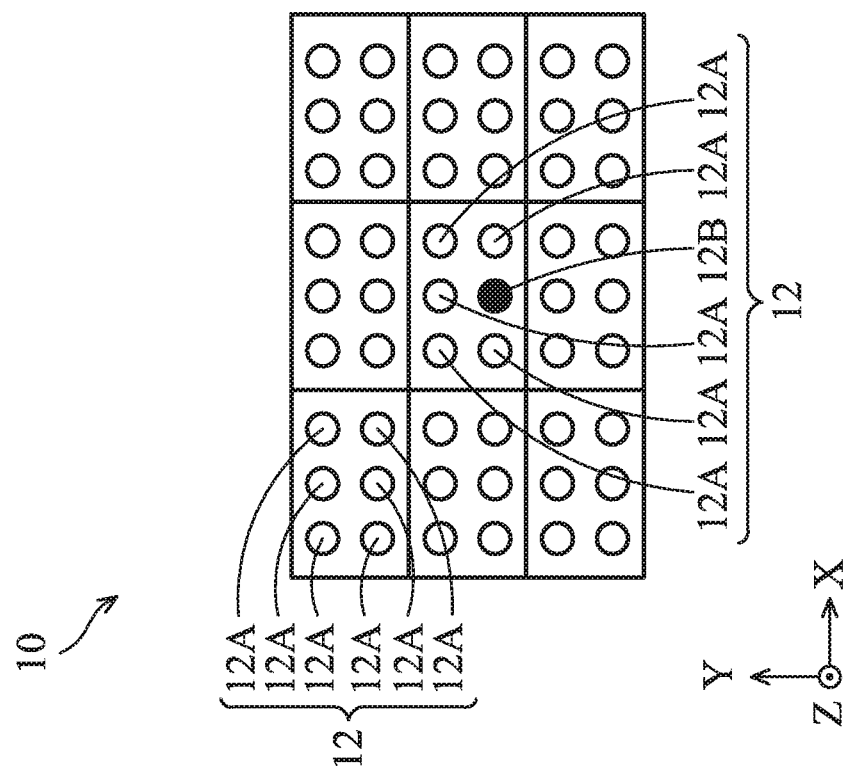
Figure 4D:
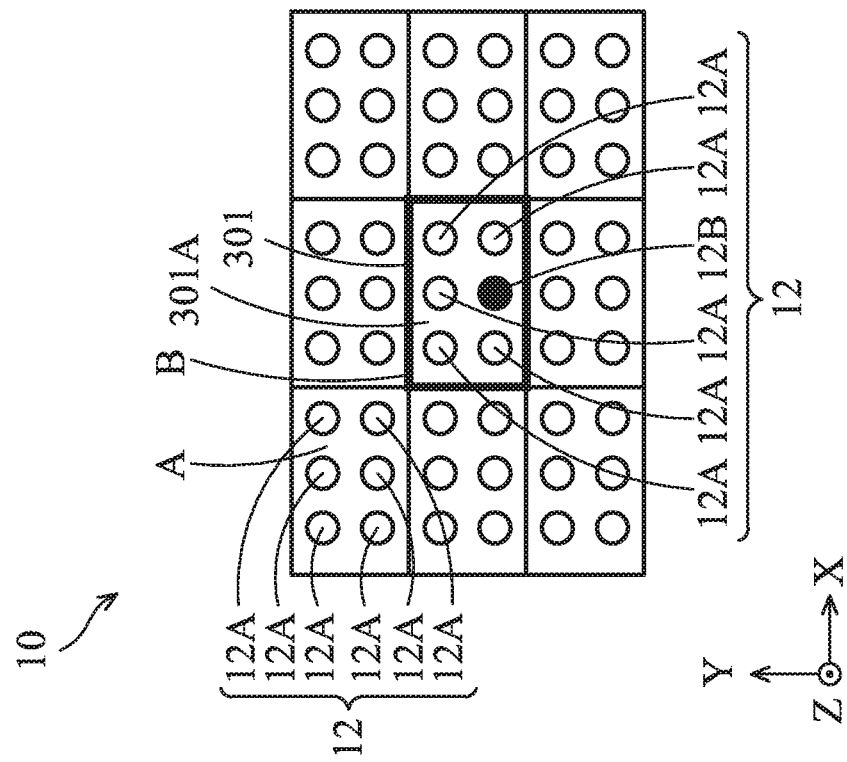

FIGS. 4A to 4I are schematic views illustrating the steps of the light source (e.g. LED) qualification method 200, such as operations 210 to 260. In FIG. 4A, a substrate 10 having a plurality of light source groups 12 disposed thereon is provided. Please noted that there are nine light source groups 12 on the substrate 10 in FIG. 4A, but the present disclosure is not limited thereto. In some embodiments, the light source groups 12 may include qualified light sources 12A and unselected light sources 12B. In this embodiment, six light sources 12A or 12B form a light source group 12, but the present disclosure is not limited thereto. The number of the light sources in one light source group may be determined based on different requirements.

In FIG. 4B, a first region 301 defined by a first opening 301A of the first mask is chosen to allow some of the light sources 12A or 12B to be exposed from the first opening 301A (indicated by the position A in FIG. 4B), which corresponds to operations 210 and 220 shown in FIG. 3. In some embodiments, the first region 301 may be a region formed by six light sources 12A or 12B (e.g. LED dies), but the present disclosure is not limited thereto. Afterwards, operations 230 and 240 are performed with first light to determine whether there are any unselected light sources 12B in the first region 301, and the acquired data may be recorded. It should be noted that other light sources which are not positioned in the first region 301 are covered by the first mask, and only the light sources exposed from the first opening 301A may be illuminated by the first light. At this moment, the substrate 10 is positioned at a first position.

Figure 4C:
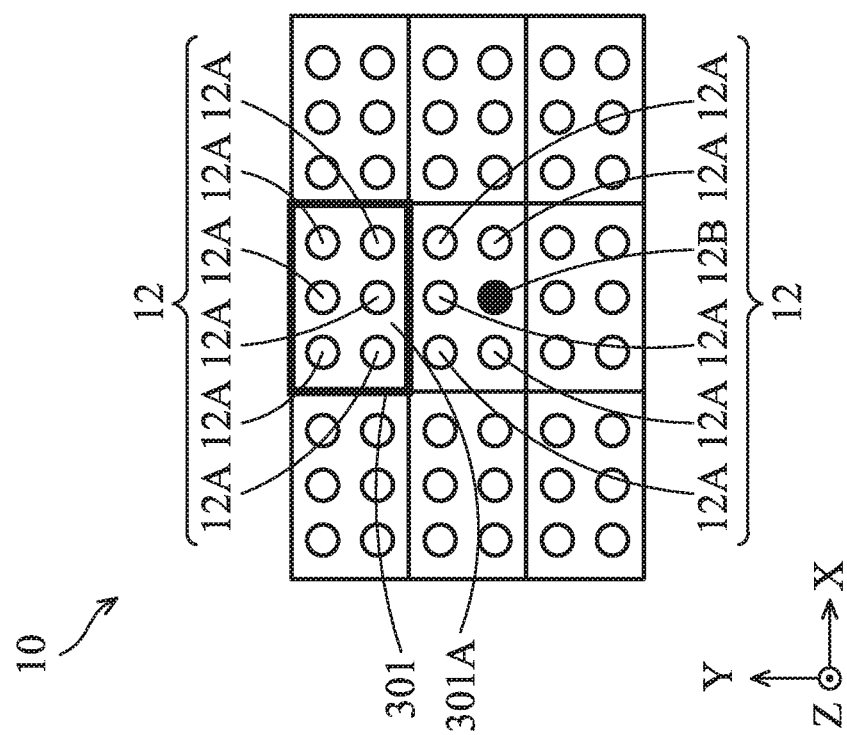

In FIG. 4C, the substrate 10 may be moved from the first position shown in FIG. 4B (corresponding to the position A) to a second position that is determined in operation 220, so another light source group 12 that includes different light sources of the light source group 12 selected in FIG. 4B may be positioned in the first region 301, but the present disclosure is not limited thereto. For example, the substrate 10 may be moved in X or Y directions, and is not limited thereto. Afterwards, operations 230 and 240 may be performed again, and then the substrate 10 may be moved to another position until the whole substrate 10 is scanned. In this embodiment, for example, a light source group 12 that has an unselected light source 12B is detected during the scan at a position B depicted in FIG. 4D. However, the present disclosure is not limited thereto. In other embodiments, a light source group 12 may include more than one unselected light source 12B. In some embodiments, there may be more than one light source groups 12 that include unselected light source 12B in one substrate 10.

In FIG. 4E, a second region 302 defined by a second opening 302A of a second mask (corresponding to the position C) may be chosen based on the position of the unselected light source 12B, which corresponds to operations 250, 260 and 220 shown in FIG. 3. It should be noted that other light sources outside the second region 302 are covered by the second mask rather than exposed from the second opening 302A. Afterwards, second light is irradiated upon a light source sub-group 12' of one of the light source groups 12 that may include at least one selected light source 12A or unselected light source 12B, which corresponds to operations 230 and 240 in FIG. 3.

During the operation depicted in FIG. 4E, each light source sub-group 12' may include at least one light source 12A or 12B in this embodiment, such as include two light sources 12A or 12B, but the present disclosure is not limited thereto. The number of the light sources in one light source sub-group may be adjusted based on design requirements, such as having 6 or less light sources. Afterwards, other light source sub-groups 12' of one of the light source groups 12 are scanned until the light source group 12 that corresponds to the position B (shown in FIG. 4D) is scanned, as shown in FIGS. 4F and 4G. In some embodiments, the scanning may be performed in X direction, but the present disclosure is not limited thereto. For example, the scanning may be done from scanning the positions C, D to E (shown in FIGS. 4E to 4G), and a light source sub-group that has an unselected light source 12B is detected during the scan depicted in FIG. 4F.

Figure 4H:
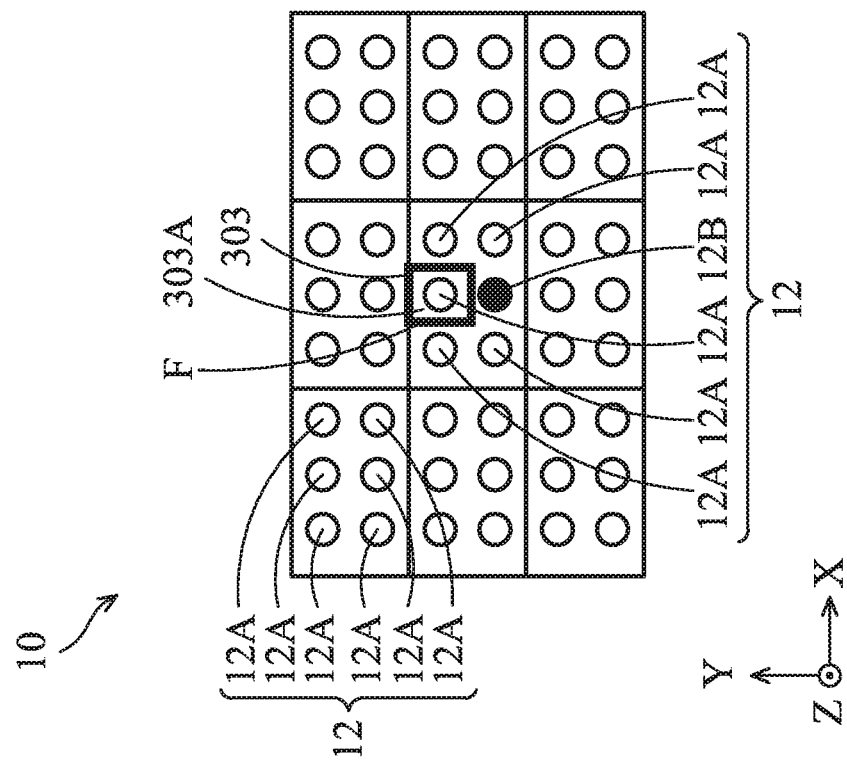
Figure 4G:
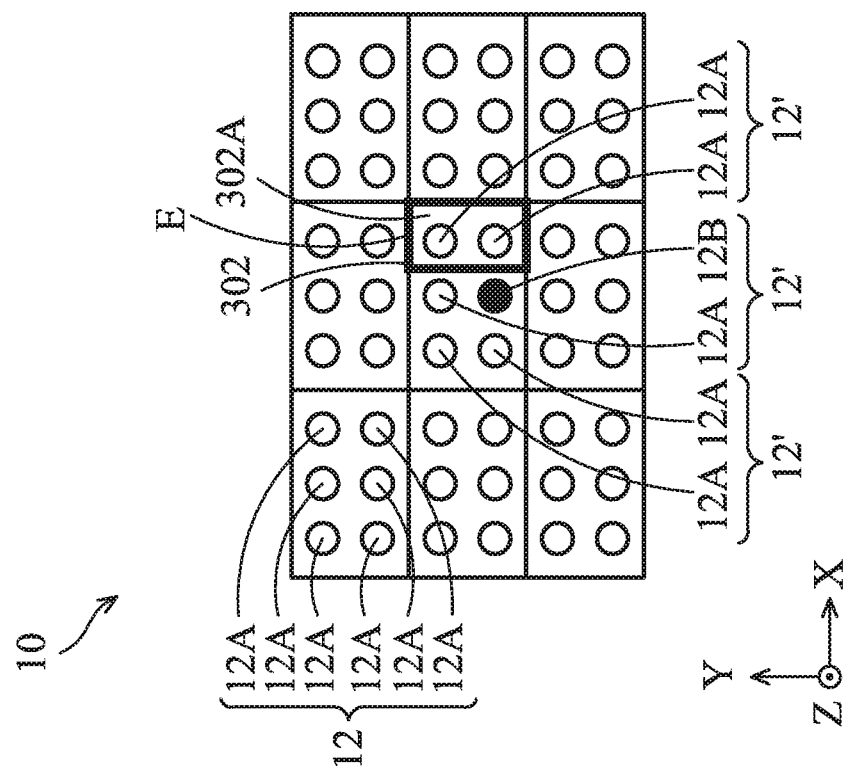

In FIG. 4H, a third region 303 defined by a third opening 303A of a third mask may be chosen based on the position of the unselected light source 12B (i.e. position F), which corresponds to operations 250, 260 and 220 shown in FIG. 3. It should be noted that other light source outside the third region 303 are covered by the third mask rather than exposed from the third opening 303A. Afterwards, a third light is irradiated upon one light source sub-group of one of the light source groups 12 that includes at least one unselected light source 12B through the third opening 303A.

Figure 4I:
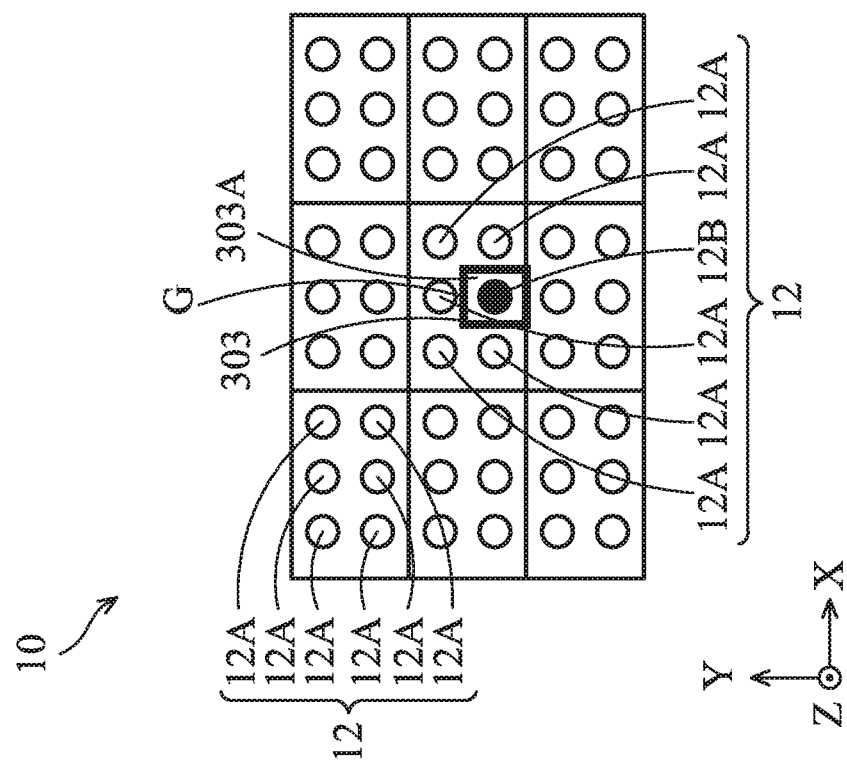

It should be noted that during the operations illustrated in FIG. 4H, each light source sub-group may include at least one light source 12A or 12B in this embodiment, but is not limited thereto. Subsequently, as shown in FIG. 4I, another light source sub-group of one of the light source sub-groups 12' is scanned until all of the light source sub-groups of the chosen light source sub-group 12' (such as the light source sub-group 12' corresponding to position D shown in FIG. 4F) have been scanned. For example, a light source sub-group that has an unselected light source 12B is detected during the scan depicted in FIG. 4I (i.e. corresponding to the position G). As a result, the position of a single unselected light source 12B may be determined (e.g. position G). In some embodiments, the light source sub-group in FIG. 4H or 4I may be a single light source (e.g. light source 12A or 12B), and the numbers and the position of scanning may be changed (e.g. increased or decreased) based on design requirements. The scanning direction may be X or Y direction, but is not limited thereto.

In some embodiments, the unselected light source on the substrate may be removed, marked or destroyed. In some embodiments, the unselected light source on the substrate may be removed, and then other qualified (selected) light source may be provided to compensate the vacancy created by the removal of unselected light source. In some embodiments, the position of the unselected light source may be recorded to allow the unselected light source being recognized in following processes. For example, the position may be stored in a memory, such as a memory disposed at the computer 60, but the present disclosure is not limited thereto.

Unselected light sources may have a different material structure than qualified (selected) light sources, as well as the band gap. As a result, the profile of the photoluminescent light illuminated from an unselected light sources is different from that of the qualified (selected) light sources, such as the intensity or the wavelength of a peak of the photoluminescent light because the photoluminescent light relates to the band gap. FIG. 5A is a diagram showing the photoluminescent light relationship between a qualified (selected) light sources and an unselected light sources. It should be noted that the intensity of the qualified (selected) light sources may be greater than the intensity of the unselected light source at a peak wavelength (indicated by the dotted line) in FIG. 5A. For example, the intensity of the qualified (selected) light source at the peak may be 0.626 (a.u.), while the intensity of the unselected light source at the peak may be 0.541 (a.u.), but the present disclosure is not limited thereto. The values shown in FIGS. 5A to 5C are merely examples, and the values may be different based on design requirements. In some embodiments, the photoluminescent light illustrated from an unselected light source and a qualified (selected) light source may have a substantially identical intensity but have other differences (such as the wavelength of the peak). Whether a data is irradiated from a selected sample or an unselected sample may be determined on different design requirement.

In some embodiments, whether a light source is selected may also be determined by the wavelength of the peak of the photoluminescent light. FIG. 5B is a diagram showing the photoluminescent light relationship between a qualified (selected) light source and an unselected light source, and FIG. 5C is an enlarged view of FIG. 5B. It should be noted that in this embodiment, the wavelength of qualified light source may be about 547.3 nm, and the wavelength of unselected light source may be about 555.5 nm, which is different from the wavelength of qualified light source, but the present disclosure is not limited thereto. As a result, whether the light source group or the light source sub-group to be scanned has any unselected light sources may be determined by comparing the wavelength of the peaks.

In some embodiments, the number of unselected light sources (e.g. LED defect rate) in a light source group or a light source sub-group may be determined by the intensity decay rate of a detected photoluminescent light. For example, the intensity decay rate of a detected photoluminescent light may be substantially proportional or similar to the unselected rate of a light source group or a light source sub-group. An example is shown in Table 3.

It should be noted that the difference between samples C and D is the number of unselected light sources. In some embodiments, the intensity rate may be calculated by the following equation:

Intensity rate=((Light intensity of light emitted from total light sources)−(Light intensity of light emitted from selected light sources))/(Light intensity of light emitted from total light sources)

For example, the intensity decay rate for sample A would be calculated by ((Light intensity of 405 light sources)−(Light intensity of light emitted from (405-36) light sources))/(Light intensity of light emitted from 405 light sources). In some embodiments, the measurement may be performed at multiple different positions (such as the samples A, B, C and D shown in Table 3) for accuracy.

In some embodiments, the accuracy may be reduced when the size of the opening of the mask is too small. For example, for samples A, B, C and D, the ratio of the intensity decay rate to the unselected rate is closer to 1 when compared with sample E. That is, the accuracies of the samples A, B, C and D are higher than the accuracy of sample E. That is because when the opening of the mask used for the operation is too small, less light sources will be illuminated, and lower photoluminescent light will be emitted and deteded. As a result, the accuracy in cases where there are smaller openings would be reduced.

In order to resolve this issue, when the opening of the mask used for the operation is too small, the light source 20 may be changed to a point source (such as the light source 70 in FIG. 1A) that provides a higher illumination intensity rather than a surface source (such as the light source 20 in FIG. 1A). As a result, the accuracy of the method can be further enhanced. For example, referring to Table 3, the ratio of the intensity decay rate to the unselected rate of the sample F (the ratio is 0.35/0.50=0.7) is closer to 1 compared to the sample E (the ratio is 5.6/10.00=0.56). That is, the intensity decay rate is closer to the unselected rate for a sample using a point source, which means the accuracy increases.

In some embodiments, the light source qualification method 200 may be combined with other light source qualification method (such as electroluminescence method or automated optical inspection method, etc.) to enhance the accuracy when using a mask having a small opening. For example, after performing the light source qualification method 200, such as after the situation in FIG. 4G, the two light sources may be inspected by automated optical inspection method performed by, for example, the image sensor 50 and the light source 70 rather than performing the operations depicted in FIGS. 4H and 4I and described above.

In some embodiments, the light sources are separated into different groups based on their quality (e.g. wavelength,

TABLE 3

Figure 6:
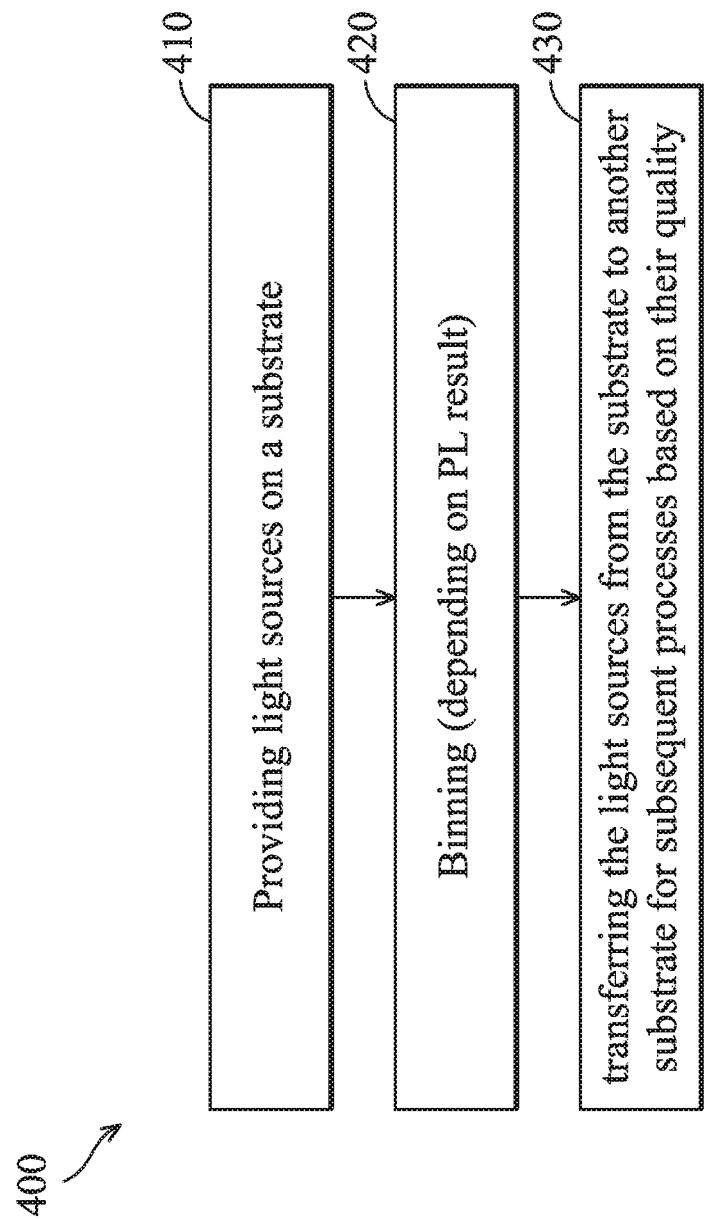
FIG. 6 is a flowchart of a binning process in accordance with some embodiments.

| Sample # | A | | B | | C | | D | | E | F |
|---|---|---|---|---|---|---|---|---|---|---|
| Light source type | surface source | | | | | | | | | point source |
| Mask | 31 | | 32 | | 33 | | | | 34 | 35 |
| Total light sources (#) | 405 | | 300 | | 169 | | | | 40 | 2 |
| Unselected light sources (#) | 36 | | 36 | | 36 | | 16 | | 4 | 1 |
| Unselected rate (%) | 8.89 | | 12.00 | | 21.30 | | 9.47 | | 10.00 | 50.00 |
| Position | 1 | 2 | 1 | 2 | 1 | 2 | 1 | 2 | 1 | 1 |
| Intensity decay rate (%) | 11.4 | 11.5 | 13.5 | 13.3 | 19.5 | 17.9 | 10.2 | 9.3 | 5.6 | 35.0 | brightness, etc.) determined from the result of the photoluminescence process (i.e. binning) using the light source qualification method 200. An embodiment of the binning process 400 (including operations 410, 420 and 430) is shown in FIG. 6, which is a flowchart of a binning process in accordance with some embodiments. In operation 410, light sources are provided on a substrate (such as a sapphire substrate). In operation 420, the light sources are separated into different groups based on their quality as determined by the results of the aforementioned method. In operation 430, after the qualities of the light sources have been determined, they are transferred from the substrate 10 to another substrate, such as a carrier or circuit board, for subsequent processing based on their quality.

Figure 7:
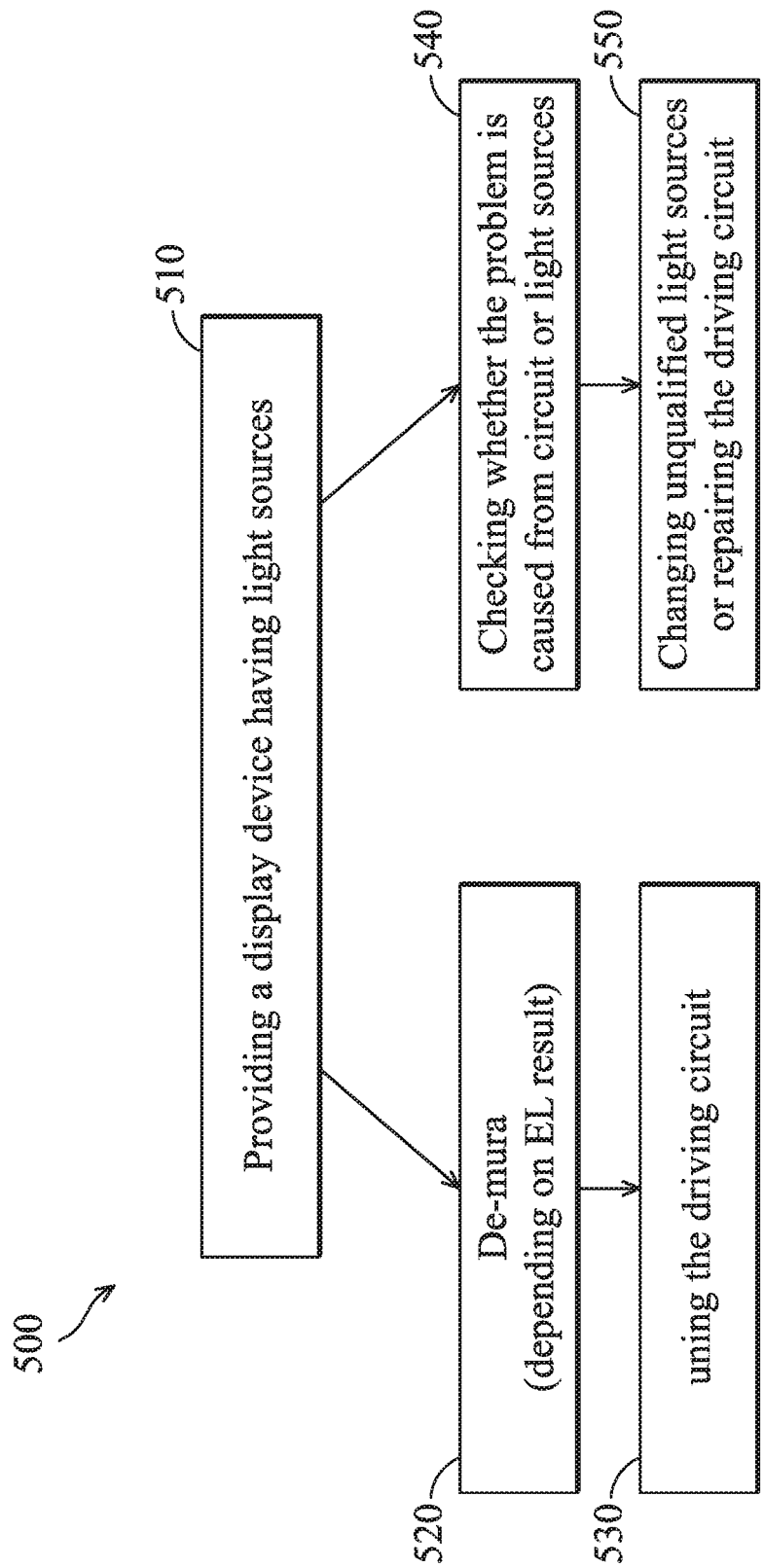
FIG. 7 is a flowchart of a method for determining the quality of a display in accordance with some embodiments.

In some embodiments, the qualified light sources determined by the light source qualification method 200 may be provided on a driving substrate for forming an electronic device, such as a display device. A method 500 (including operations 510, 520, 530, 540 and 550) for determining the quality of the display is shown in FIG. 7 in accordance with some embodiments. In operation 510, a display device having light sources is provided. In operation 520, if the brightness of the display device is not uniform (i.e. having "mura" issue), a de-mura process is performed to analyze the brightness difference of different light sources. The de-mura process may be performed by, for example, electroluminescence method. In operation 530, driving circuit of the display device may be tuned to change the brightness of different light sources, so the issue may be solved. In operation 540, the display device may be inspected by the photoluminescence method to determine whether the problem is caused from the driving circuit or the light sources itself. Afterwards, operation 550 may be performed to change unqualified light sources or to repair the driving circuit.

Some advantages may be achieved by the light source qualification method 200. For example, this method has a fast inspection speed (about 75 ms to 1000 ms), which reduces the required inspection time. Furthermore, the inspection conditions may be easily adjusted based on different requirements. Moreover, only the position of the substrate is moved rather than moving the light source, detector and the mask, so errors may be reduced. The method is also more suitable for inspection of a large area than the electroluminescence method or the automated optical inspection method. The set of masks used in this method may be adjusted based on the sample required to be inspected. Another advantage is that the light source qualification method 200 may be combined with other light source qualification methods such as the electroluminescence method, the automated optical inspection method, or artificial intelligence to further increase the accuracy.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. A method of manufacturing a light source carrier, comprising:
   providing a substrate with a plurality of light source groups disposed thereon, wherein each light source group comprises at least one light source;
   irradiating a first light upon one of the light source groups through a first mask;
   capturing a photoluminescent light emitted by the one of the light source groups to acquire data;
   comparing the data with a reference to determine whether the one of the light source groups is qualified;
   providing a carrier; and
   transferring the one of the light source groups from the substrate to the carrier if the one of the light source groups is qualified.

2. The method of claim 1, further comprising:
   irradiating a second light upon one of light source sub-groups of one of the light source groups through a second mask if the one of the light source groups is not qualified;
   capturing another photoluminescent light emitted by the one of light source sub-groups to acquire another data;
   comparing the another data with the reference to determine whether the one of light source sub-groups is qualified; and
   transferring the one of the light source sub-groups from the substrate to the carrier if the one of the light source sub-groups is qualified.

3. The method of claim 2, wherein the first mask comprises a first opening, the second mask comprises a second opening, and an area of the first opening is greater than an area of the second opening.

4. The method of claim 2, wherein an intensity of the first light is less than an intensity of the second light.

5. The method of claim 1, further comprising:
   moving the substrate from a first position to a second position;
   irradiating the first light upon another one of the light source groups through the first mask;
   capturing another photoluminescent light emitted by the another one of the light source groups to acquire another data;
   comparing the another data with the reference to identify whether the another one of the light source groups is qualified.

6. The method of claim 1, wherein the step of comparing the data with the reference comprises:
   comparing an intensity of a peak of the photoluminescent light with the reference.

7. The method of claim 1, wherein the step of comparing the data with the reference comprises:
   comparing a wavelength of a peak of the photoluminescent light with the reference.

8. The method of claim 1, further comprising recording a result of whether the one of the light source groups is qualified or not.

9. A method of manufacturing an electronic device, comprising:

providing a substrate with a plurality of light source groups disposed thereon, wherein each light source group comprises at least one light source;
irradiating a first light upon one of the light source groups through a first mask;
capturing photoluminescent light emitted by the one of the light source groups to acquire data;
comparing the data with the reference to identify whether the one of the light source groups is qualified;
providing a driving substrate; and
transferring the one of the light source groups from the substrate to the driving substrate and bonding the one of the light source groups on the driving substrate if the one of the light source groups is qualified.

10. The method of claim 9, further comprising:
irradiating a second light upon one of light source sub-groups of one of the light source groups through a second mask if the one of the light source groups is not qualified;
capturing another photoluminescent light emitted by the one of light source sub-groups to acquire another data;
comparing the another data with the reference to determine whether the one of light source sub-groups is qualified; and
transferring the one of the light source sub-groups from the substrate to the carrier if the one of the light source sub-groups is qualified.

11. The method of claim 10, wherein the first mask comprises a first opening, the second mask comprises a second opening, and the area of the first opening is greater than the area of the second opening.

12. The method of claim 10, wherein an intensity of the first light is less than an intensity of the second light.

13. The method of claim 9, wherein the step of comparing the data with the reference comprises:
comparing an intensity of a peak of the photoluminescent light with the reference.

14. The method of claim 9, wherein the step of comparing the data with the reference comprises:
comparing a wavelength of a peak of the photoluminescent light with the reference.

15. A method of determining whether at least one light source is qualified, comprising:
providing a substrate with a plurality of light source groups disposed thereon, wherein each light source group comprises at least one light source;
irradiating a first light upon one of the light source groups through a first mask;
capturing a photoluminescent light emitted by the one of the light source groups to acquire data; and
comparing the data with reference to identify whether the one of the light source groups is qualified.

16. The method of claim 15, further comprising:
irradiating a second light upon one of light source sub-groups of one of the light source groups through a second mask if the one of the light source groups is not qualified;
capturing another photoluminescent light emitted by the one of light source sub-groups to acquire another data;
comparing the another data with the reference to determine whether the one of light source sub-groups is qualified; and
transferring the one of the light source sub-groups from the substrate to the carrier if the one of the light source sub-groups is qualified.

17. The method of claim 16, wherein the first mask comprises a first opening, the second mask comprises a second opening, and an area of the first opening is greater than an area of the second opening.

18. The method of claim 16, wherein an intensity of the first light is less than an intensity of the second light.

19. The method of claim 15, wherein the step of comparing the data with the reference comprises:
comparing the intensity of a peak of the photoluminescent light with the reference.

20. The method of claim 15, wherein the step of comparing the data with the reference comprises:
comparing a wavelength of a peak of the photoluminescent light with the reference.

* * * * *